United States Patent
Ying et al.

(10) Patent No.: US 10,672,832 B2
(45) Date of Patent: Jun. 2, 2020

(54) MAGNETIC DETECTION CIRCUIT, MRAM AND OPERATION METHOD THEREOF

(71) Applicant: Taiwan Semiconductor Manufacturing Co., Ltd., Hsinchu (TW)

(72) Inventors: Ji-Feng Ying, Hsinchu (TW); Baohua Niu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 29 days.

(21) Appl. No.: 15/875,140

(22) Filed: Jan. 19, 2018

(65) Prior Publication Data

US 2019/0140020 A1 May 9, 2019

Related U.S. Application Data

(60) Provisional application No. 62/583,057, filed on Nov. 8, 2017.

(51) Int. Cl.
| | |
|---|---|
| *H01L 27/22* | (2006.01) |
| *G11C 11/16* | (2006.01) |
| *H01F 10/14* | (2006.01) |
| *H01F 10/16* | (2006.01) |
| *H01F 10/32* | (2006.01) |
| *H01L 43/08* | (2006.01) |
| *H01L 43/12* | (2006.01) |

(52) U.S. Cl.
CPC .......... *H01L 27/228* (2013.01); *G11C 11/161* (2013.01); *G11C 11/1675* (2013.01); *H01F 10/14* (2013.01); *H01F 10/16* (2013.01); *H01F 10/329* (2013.01); *H01F 10/3236* (2013.01); *H01F 10/3286* (2013.01); *H01L 43/08* (2013.01); *H01L 43/12* (2013.01)

(58) Field of Classification Search
CPC ....... H01L 27/228; H01L 43/08; H01L 43/12; G11C 11/161; H01F 10/14; H01F 10/16; H01F 10/3236; H01F 10/3286; H01F 10/329
See application file for complete search history.

(56) References Cited

U.S. PATENT DOCUMENTS

| | | | |
|---|---|---|---|
| 2006/0018148 A1* | 1/2006 | Phillips | .................... G11C 11/16 365/158 |
| 2006/0180880 A1 | 8/2006 | Wang et al. | |
| 2014/0029334 A1* | 1/2014 | Katti | ....................... G11C 11/16 365/158 |

(Continued)

*Primary Examiner* — Tri M Hoang
(74) *Attorney, Agent, or Firm* — McClure, Qualey & Rodack, LLP

(57) ABSTRACT

A magnetic detection circuit for a magnetic random access memory (MRAM) is provided. The magnetic detection circuit includes a sensing array including a plurality of sensing cells and a controller. Each of the sensing cells includes a first magnetic tunnel junction (MTJ) device. The controller is configured to access the first MRAM cells to detect the external magnetic field strength of the MRAM. The controller determines whether to stop the write operation of a plurality of memory cells of the MRAM according to the external magnetic field strength of the MRAM, and each of the memory cells includes a second MTJ device. The first MTJ device is smaller than the second MTJ device.

20 Claims, 12 Drawing Sheets

(56) References Cited

U.S. PATENT DOCUMENTS

2016/0260466 A1* 9/2016 Katayama ............. G11C 11/161
2017/0040530 A1   2/2017 Doyle et al.
2018/0350419 A1* 12/2018 Koike ................... G11C 11/161

* cited by examiner

| Configuration | | 1st | 2nd | 3rd | 4th |
|---|---|---|---|---|---|
| Original State | FL | ↑ | ↑ | ↓ | ↓ |
| | AP1 | ↓ | ↓ | ↓ | ↓ |
| | AP2 | ↑ | ↑ | ↑ | ↑ |
| Write State | FL | ↓ | ↓ | ↑ | ↑ |
| | AP1 | ↓ | ↓ | ↓ | ↓ |
| | AP2 | ↑ | ↑ | ↑ | ↑ |
| External Field | | ↑ | ↓ | ↑ | ↓ |
| Field Threshold | | Medium | Medium | High | Low |

FIG. 3B

MAGNETIC DETECTION CIRCUIT, MRAM AND OPERATION METHOD THEREOF

CROSS REFERENCE TO RELATED APPLICATIONS

This Application claims priority of U.S. Provisional Application No. 62/583,057, filed on Nov. 8, 2017, the entirety of which is incorporated by reference herein.

BACKGROUND

An MRAM (magnetic random access memory) is a form of non-volatile memory capable of storing bits of digital information ("0" or "1"). In the MRAM, digital data is not stored as an electrical charge as it is in traditional RAM components, but rather the bit state ("0" or "1") is stored via resistive states (high resistance or low resistance) in magnetic storage elements which do not require constant electrical power to retain their state.

MRAM may be a cost-effective solution for long-term data retention and rapid on/off applications such as mobile devices and general consumer electronic systems. Compared with static random access memory (SRAM) and flash memory, MRAM can provide fast, low-power, nonvolatile storage.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 3B is a table illustrating the relationship between 4 possible configurations of the external magnetic field and magnetization directions of the free layer and the pinned layers of the MTJ device of FIG. 3A.

DETAILED DESCRIPTION

Figure 1:
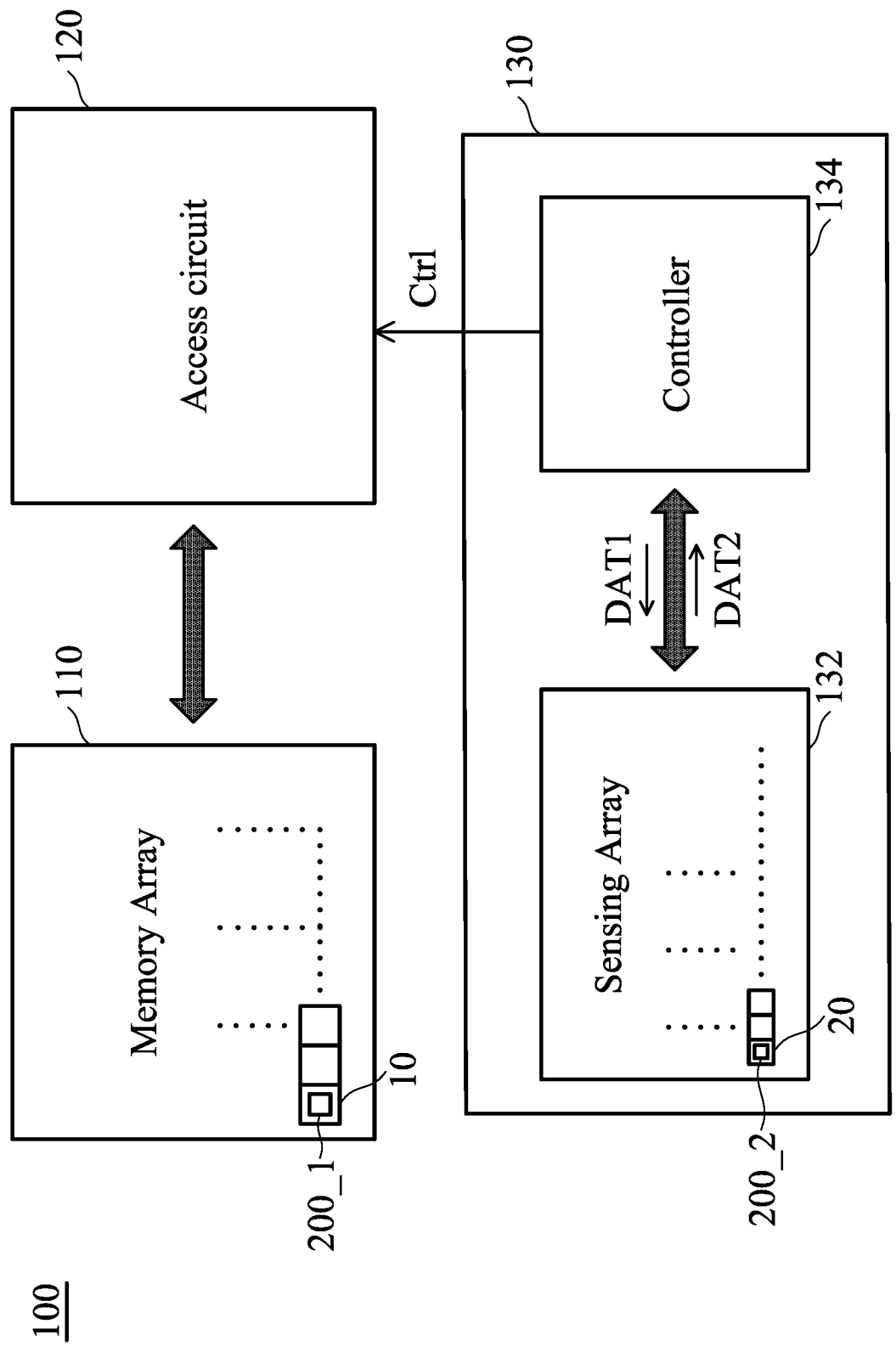
FIG. 1 shows a magnetic random access memory (MRAM), in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. In some embodiments, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

FIG. 1 shows a magnetic random access memory (MRAM) 100, in accordance with some embodiments of the disclosure. The MRAM 100 includes a memory array 110, an access circuit 120, and a magnetic detection circuit 130. The memory array 110 is formed by multiple memory cells 10 arranged in multiple rows and multiple columns. The memory cells 10 of the memory array 110 are used to store data, and each memory cell 10 includes a magnetic tunnel junction (MTJ) device 200_1 capable of storing 1-bit data. The access circuit 120 includes the circuits for accessing the memory array 110, such as a row decoder, a column decoder, a sense circuit having multiple sense amplifiers, and a writing circuit having multiple writing drivers. According to the address information, the access circuit 120 is capable of performing a read operation to read data from the memory array 110 and/or performing a write operation to write (or program) data into the memory array 110. The magnetic detection circuit 130 is capable of detecting an external magnetic field for the MRAM 100. When the magnetic detection circuit 130 detects that an external magnetic field strength MF of the MRAM 100 exceeds a threshold strength TH, the magnetic detection circuit 130 provides a control signal Ctrl to the access circuit 120, so as to stop the write operation of the MRAM 100. It should be noted that a read operation of the MRAM 100 will not be stopped when the write operation of the MRAM 100 is stopped in response to the control signal Ctrl.

The magnetic detection circuit 130 includes a sensing array 132 and a controller 134. The sensing array 132 is formed by multiple sensing cells 20 arranged in multiple rows and multiple columns. Each sensing cell 20 includes an MTJ device 200_2. In some embodiments, the MTJ devices 200_1 and 200_2 are fabricated with the same MRAM process. Configuration of the MTJ devices 200_1 and 200_2 will be described below.

The sensing cells 20 of the sensing array 132 are used to sense magnetic fields, and the MTJ device 200_2 of the sensing cell 20 is smaller than the MTJ device 200_1 of the memory cell 10. In some embodiments, the MTJ device 200_2 of the sensing cell 20 is the same size as the MTJ device 200_1 of the memory cell 10. The controller 134 periodically accesses the sensing array 132 according to a clock signal, to determine whether first data DAT1 written into the sensing array 132 is the same as second data DAT2 read from the sensing array 132. In some embodiments, the clock signal has a fixed frequency from 1 MHz to 100 kHz. The controller 134 compares the first data DAT1 and the second data DAT2 to obtain the difference (or error rate) between the first data DAT1 and the second data DAT2. If the difference (or error rate) between the first data DAT1 and the second data DAT2 exceeds a predetermined value, the magnetic detection circuit 130 determines that the external magnetic field strength MF of the MRAM 100 exceeds the threshold strength TH, and then the magnetic detection circuit 130 provides the control signal Ctrl to notice the access circuit 120. In response to the control signal Ctrl, the access circuit 120 stops the write operation of the MRAM 100 until the control signal Ctrl indicates that the external magnetic field strength MF of the MRAM 100 does not exceed the threshold strength TH.

Figure 2A:
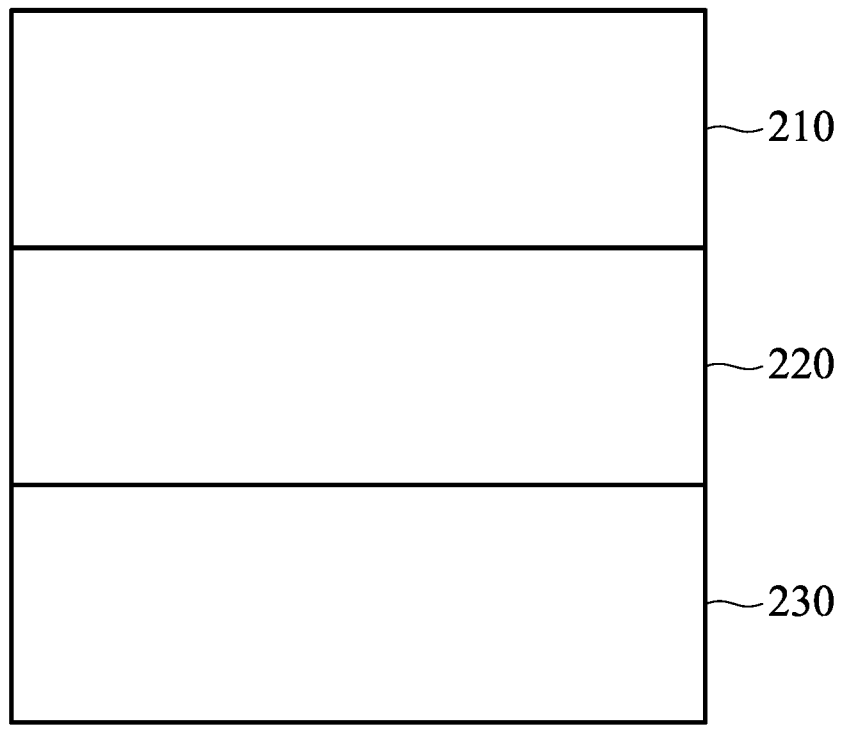
FIG. 2A shows an example schematic of an MTJ device, in accordance with some embodiments of the disclosure.

FIG. 2A shows an example schematic of an MTJ device 200, in accordance with some embodiments of the disclosure. The MTJ device 200 includes at least the following layers: a free layer 210, a tunneling barrier 220 which serves as a tunneling barrier, and a pinned layer 230. In each MTJ device 200 of the MRAM 100, the pinned layer 230 has a fixed magnetization direction (or magnetic orientation). Furthermore, the free layer 210 has a magnetization direction that, with the application of a spin torque caused by a current through the MTJ device 200, can be switched between a first direction, which is parallel to the magnetization direction of the pinned layer 230 (i.e. a parallel magnetic state P_state), and a second direction opposite to the first direction. The second direction is anti-parallel to the magnetization direction of the pinned layer 230 (i.e. an anti-parallel magnetic state AP_state).

The tunneling barrier 220 is disposed between the pinned layer 230 and the free layer 210. The tunneling barrier 220 is composed of insulating material, for example aluminum oxide, magnesium oxide, or tantalum oxide. The tunneling barrier 220 is formed thin enough to allow the transfer (tunneling) of spin-aligned electrons when the magnetization directions of the free layer 210 and the pinned layer 230 are parallel. Conversely, when the magnetization directions of the free layer 210 and the pinned layer 230 are anti-parallel, the probability of electrons tunneling through the tunneling barrier 220 is reduced.

Figure 2B:
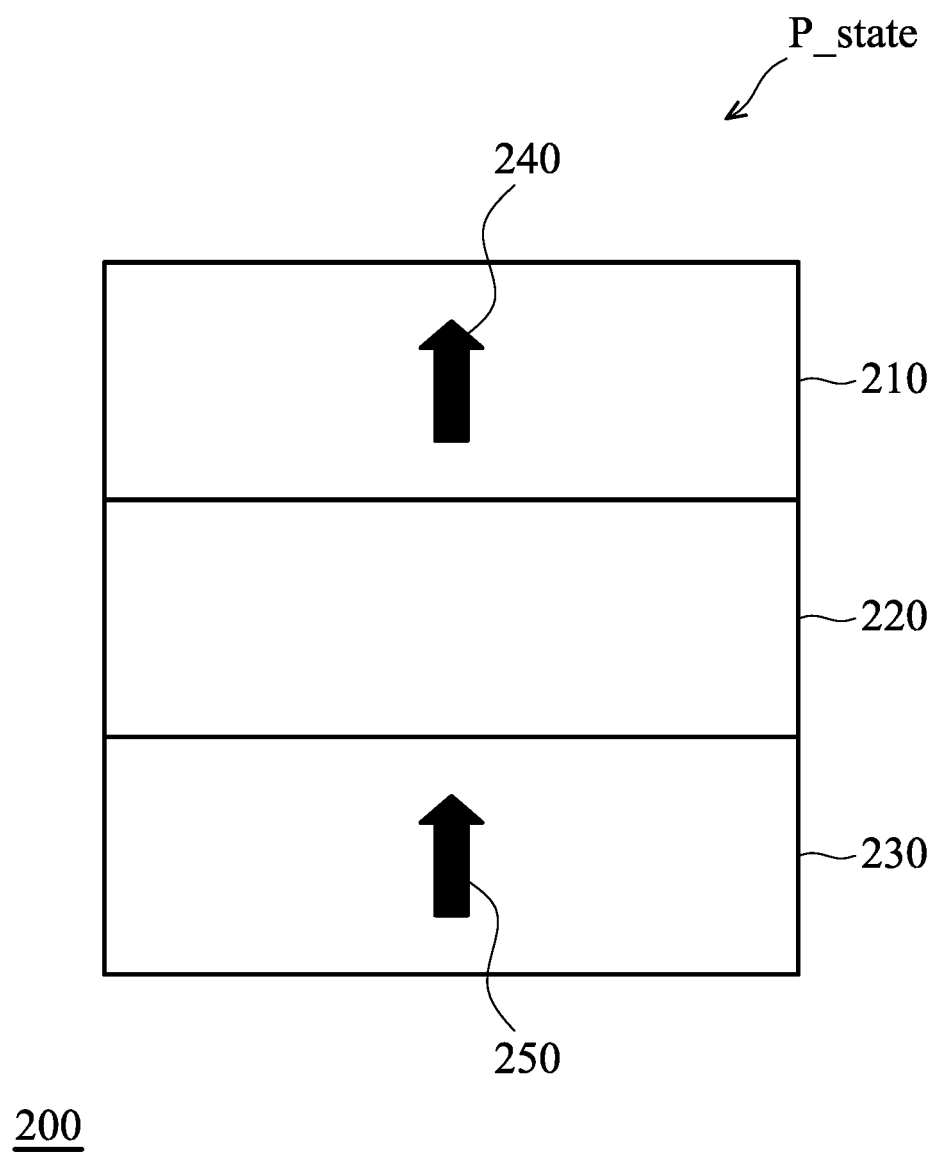
FIG. 2B shows an example of a parallel magnetic state P_state of the MTJ device of FIG. 2A.

FIG. 2B shows an example of a parallel magnetic state P_state of the MTJ device 200 of FIG. 2A. In FIG. 2B, the free layer 210 has a magnetization direction 240 from the pinned layer 230 to the free layer 210. Furthermore, the pinned layer 230 has a magnetization direction 250 from the pinned layer 230 to the free layer 210. Due to the magnetization direction 240 being parallel to the magnetization direction 250, the MTJ device 200 is in a parallel magnetic state P_state with a low resistance Rp. The resistance of the MTJ device 200 is decreased when the magnetization directions 240 and 250 become more parallel.

Figure 2C:
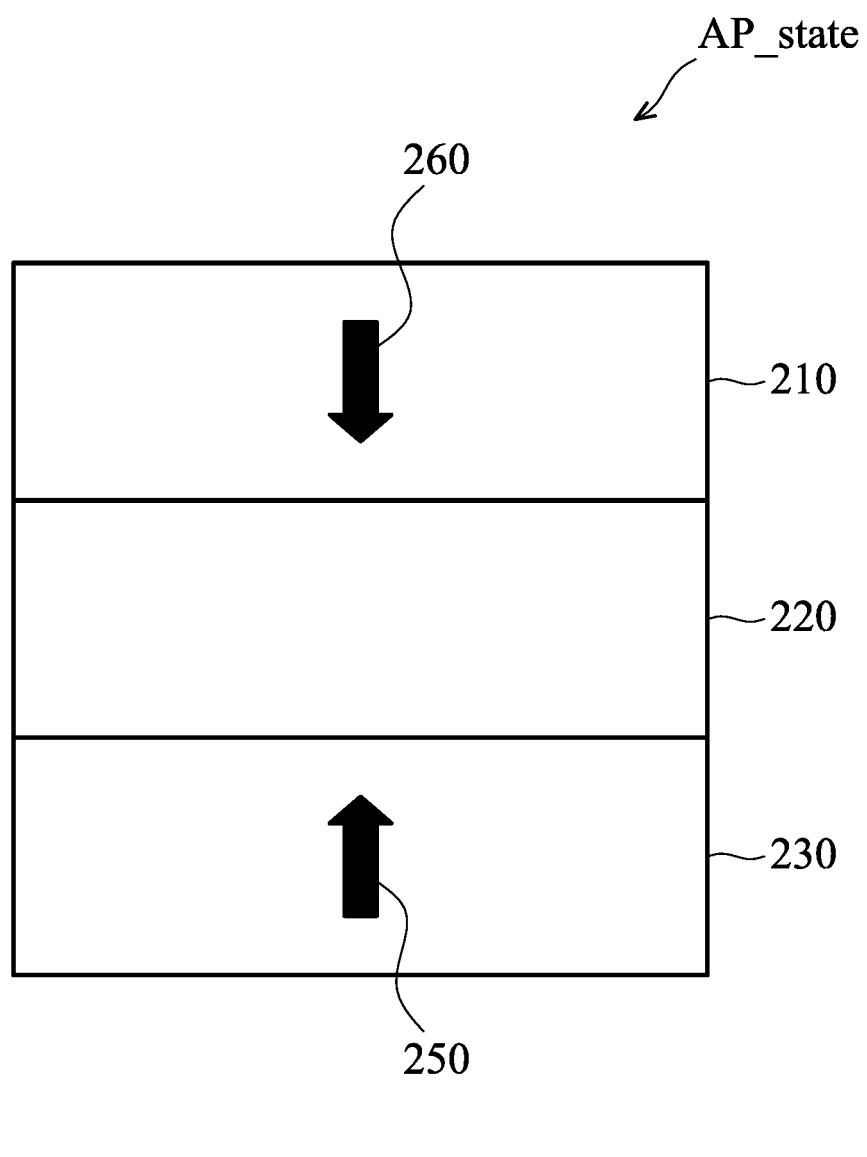
FIG. 2C shows an example of an anti-parallel magnetic state AP_state of the MTJ device of FIG. 2A.

FIG. 2C shows an example of an anti-parallel magnetic state AP_state of the MTJ device 200 of FIG. 2A. In FIG. 2C, the free layer 210 has a magnetization direction 260 from the free layer 210 to the pinned layer 230. Furthermore, the pinned layer 230 has a magnetization direction 250 from the pinned layer 230 to the free layer 210. Due to the magnetization direction 260 being anti-parallel to the magnetization direction 250, the MTJ device 200 is in an anti-parallel magnetic state AP_state with a high resistance Rap higher than the low resistance Rp, i.e., Rap>Rp. The resistance of the MTJ device 200 is increased when the magnetization directions 260 and 250 become more anti-parallel.

In such embodiments, the MTJ device 200 is a perpendicular-spin MTJ, and spins of the free layer 210 and the pinned layer 230 are perpendicular to the plane of the layers themselves.

In some embodiments, the MTJ device 200 is an in-plane-spin MTJ, and spins of the free layer 210 and the pinned layer 230 are in a same plane as the layers themselves.

In the MRAM, the resistance of the MTJ device 200 can be switched between the high resistance Rap and the low resistance Rp that respectively represent first and second logic levels. For example, the high resistance Rap of an anti-parallel magnetic state AP_state can represent a high logic level (i.e. "1"), and the low resistance Rp of a parallel magnetic state P_state can represent a low logic state (i.e. "0"). Thus, by controlling the magnetization directions of the free layer 210 and the pinned layer 230 of the MTJ device 200 with a writing current, a bit ("1" or "0") of data is stored in the MTJ device 200. Furthermore, the logic level of data stored in the MTJ device 200 can be read by passing a sense current through the MTJ device 200 and then sensing the resistance of the MTJ device 200.

For the MTJ device 200, when the external field is on the same magnetization axis of the magnetization of the free layer 210 and pinned layer 230, a write operation of the MTJ device 200 will suffer from error rate (ER) increase due to the magnetization direction of the free layer 210 is changed.

Figure 3A:
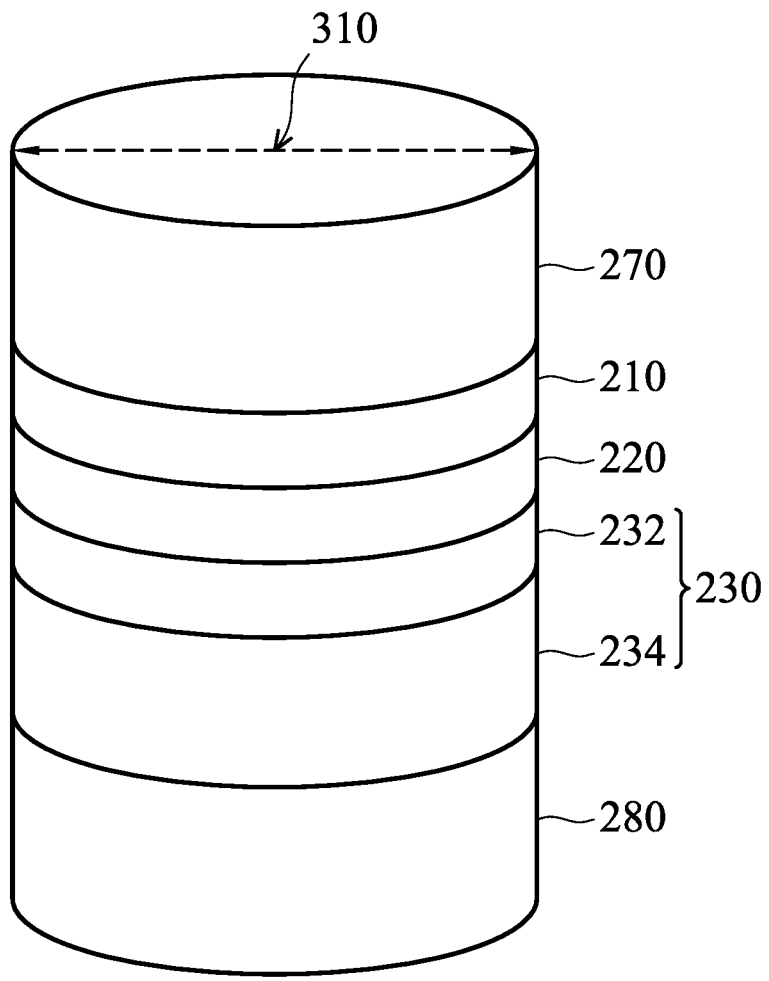
FIG. 3A shows a perspective view of an MTJ device, in accordance with some embodiments of the disclosure.

FIG. 3A shows a perspective view of an MTJ device 200A, in accordance with some embodiments of the disclosure. The MTJ device 200A includes a bottom electrode 280, a pinned layer 230, a tunneling barrier 220, a free layer 210, and a top electrode 270.

The bottom electrode 280 is formed on a substrate (not shown) of the MRAM. The bottom electrode 280 includes a conductive material such as tantalum, platinum, ruthenium, copper, aluminum, titanium, tungsten, molybdenum, tantalum nitride, nickel silicide, cobalt silicide, TiN, WN, TiAl, TiAlN, TaCN, TaC, TaSiN, metal alloys, other suitable materials, and/or combinations thereof.

The pinned layer 230 is formed on the bottom electrode 280. In some embodiments, the pinned layer 230 includes a multilayer structure formed by a first pinned layer 232 and a second pinned layer 234. The pinned layers 232 and 234 include an anti-ferromagnetic material. In anti-ferromagnetic materials, internal magnetic moments tend to align in alternating patterns. Furthermore, adjacent moments tend to cancel, and thus such materials tend to exhibit a minimal net magnetic field internally. Despite the minimal net field, anti-ferromagnetic materials may alter the behavior of magnetic fields of other materials in what is referred to as an exchange coupling effect. For example, an anti-ferromagnetic material may resist changes in the magnetic field of another exchange-coupled material. Anti-ferromagnetic materials include platinum manganese (PtMn), iridium manganese ("IrMn"), rhodium manganese ("RhMn"), and iron manganese ("FeMn").

The tunneling barrier 220 is a barrier layer formed on the pinned layer 230. The tunneling barrier 220 may include a non-magnetic material, such as magnesium (Mg). In some embodiments, the tunneling barrier 220 includes magnesium oxide (MgO), Al$_2$O$_3$, aluminum nitride (AlN), aluminum oxynitride (AlON), and/or other suitable non-magnetic material.

The free layer 210 is formed on the tunneling barrier 220. As with the pinned layer 232 and 234, the free layer 210 may include a ferromagnetic material such as a cobalt-iron compound (CoFe) and/or a cobalt-iron-boron (CoFeB) compound. The free layer 210 may also include other ferromagnetic materials, such as CoFeTa, NiFe, CoFe, CoPt, CoPd, FePt, and/or alloys of Ni, Co and Fe.

The top electrode 270 is formed on the free layer 210 such that the top electrode 270 is electrically coupled to the free layer 210. The top electrode 270 may be similar to the bottom electrode 280 in terms of composition and deposition.

In some embodiments, for the MTJ device 200A, the top electrode 270 is coupled to a bit line corresponding to the MTJ device 200A. The bottom electrode 280 is coupled to a complementary bit line corresponding to the MTJ device 200A through a selection transistor (not shown), and the complementary bit line is complementary to the bit line. Furthermore, the selection transistor is controlled by a word line corresponding to the MTJ device 200A, i.e. a gate of the selection transistor is coupled to the word line.

In some embodiments, for the MTJ device 200A, the bottom electrode 280 is coupled to a bit line corresponding to the MTJ device 200A. The top electrode 270 is coupled to a complementary bit line corresponding to the MTJ device 200A through a selection transistor (not shown), wherein the complementary bit line is complementary to the bit line. Furthermore, the selection transistor is controlled by a word line corresponding to the MTJ device 200A.

The size of the MTJ device 200A is determined by its area, diameter (labeled 310), the thickness of the pinned layer 230, the thickness of the free layer 210, and so on.

FIG. 3B is a table illustrating the relationship between 4 possible configurations of the external magnetic field and magnetization directions of the free layer 210 and the pinned layers 232 and 234 of the MTJ device 200A of FIG. 3A.

In table of FIG. 3B, "FL" represents the magnetization direction of the free layer 210. "AP1" represents the magnetization direction of the pinned layer 232. "AP2" represents the magnetization direction of the pinned layer 234.

In first configuration, the MTJ device 200A is to be written to an anti-parallel magnetic state AP_state from a parallel magnetic state A_state when the external field has a magnetization direction being parallel to the pinned layer 234. In the original state (e.g., the parallel magnetic state A_state), the free layer 210 and the pinned layer 234 have the same magnetization direction that is anti-parallel to the pinned layer 232. In the write state (e.g., the anti-parallel magnetic state A_state), the free layer 210 and the pinned layer 232 have the same magnetization direction that is anti-parallel to the pinned layer 234.

In second configuration, the MTJ device 200A is to be written to an anti-parallel magnetic state AP_state from a parallel magnetic state A_state when the external field has a magnetization direction being anti-parallel to the pinned layer 234. In the original state, the free layer 210 and the pinned layer 234 have the same magnetization direction that is anti-parallel to the pinned layer 232. In the write state, the free layer 210 and the pinned layer 232 have the same magnetization direction that is anti-parallel to the pinned layer 234.

In third configuration, the MTJ device 200A is to be written to a parallel magnetic state A_state from an anti-parallel magnetic state AP_state when the external field has a magnetization direction being parallel to the pinned layer 234. In the original state, the free layer 210 and the pinned layer 232 have the same magnetization direction that is anti-parallel to the pinned layer 234. In the write state, the free layer 210 and the pinned layer 234 have the same magnetization direction that is anti-parallel to the pinned layer 232.

In fourth configuration, the MTJ device 200A is to be written to a parallel magnetic state A_state from an anti-parallel magnetic state AP_state when the external field has a magnetization direction being anti-parallel to the pinned layer 234. In the original state, the free layer 210 and the pinned layer 232 have the same magnetization direction that is anti-parallel to the pinned layer 234. In the write state, the free layer 210 and the pinned layer 234 have the same magnetization direction that is anti-parallel to the pinned layer 232.

The external field affect the write error rate of the MTJ device 200A the most when the field direction is along magnetization axis of the MRAM cell. In an asymmetrical effect for the write error rate, the external field thresholds, at which significant write error rate degradation happens, are at very different levels for the four configurations. In some embodiments, due to low field threshold, only the worst case may cause a field issue, which is the fourth configuration.

As described above, the MTJ device 200_2 of the sensing cell 20 within the sensing array 132 is smaller than the MTJ device 200_1 of the memory cell 10 within the memory array 110. Therefore, compared with the MTJ device 200_1 of the memory cell 10 within the memory array 110, the MTJ device 200_2 of the sensing cell 20 within the sensing array 132 has the smaller area, smaller diameter 310, smaller thickness of the pinned layer 230, or smaller thickness of the free layer 210. In some embodiments, by adjusting the parameters or layout in the MRAM process, the sizes of the MTJ devices 200_1 and 200_2 are adjusted. For example, the diameter 310 of the MTJ device 200_1 of the memory cell 10 and the diameter 310 of the MTJ device 200_2 of the sensing cell 20 are adjusted through MRAM cell placement mask in lithography.

Compared with the memory cells 10, the sensing cells 20 have a faster error rate increase under a transient external field because it is more sensitive to the influence of the external field. Compared with the memory cells 10 with larger size MTJ device 200_1, the sensing cells 20 with smaller size MTJ device 200_2 will be easily switched by a transient external field because the resistances of the MTJ devices 200_2 of the sensing cells 20 are easier to change by transient external field.

Figure 4A:
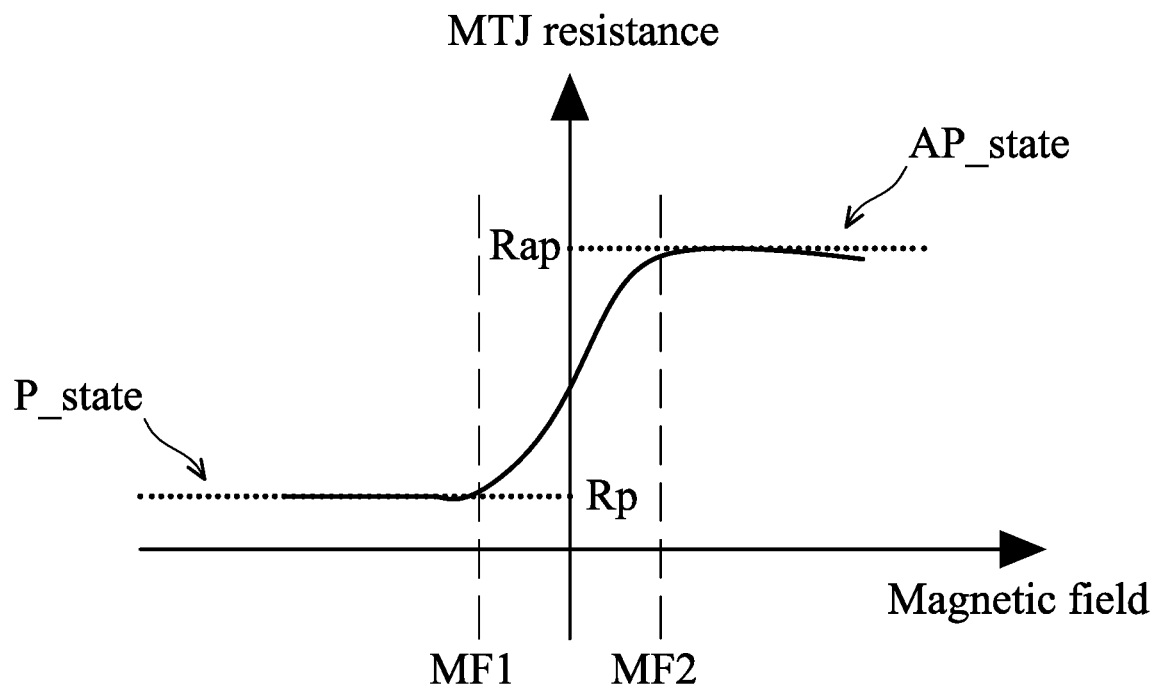
FIG. 4A shows a diagram illustrating the relationship between the resistance of the MTJ device of the sensing cell and the external magnetic field.

FIG. 4A shows a diagram illustrating the relationship between the resistance of the MTJ device 200_2 of the sensing cell 20 and the external magnetic field. When the external magnetic field is less than a magnetic field value MF1, the resistance of the MTJ device 200_2 is switched to the low resistance Rp, and the MTJ device 200_2 is operated in a parallel magnetic state P_state. When the external magnetic field is gradually increased from the magnetic field value MF1, the resistance of the MTJ device 200_2 is also increased. When the external magnetic field exceeds a magnetic field value MF2, the resistance of the MTJ device 200_2 is switched to the high resistance Rap, and the MTJ device 200_2 is operated in an anti-parallel magnetic state AP_state.

The magnetic field values MF1 and MF2 of the MTJ device 200_2 are determined by adjusting the size of the MTJ device 200_2 according to customer requirements or write error performance under external magnetic field.

Figure 4B:
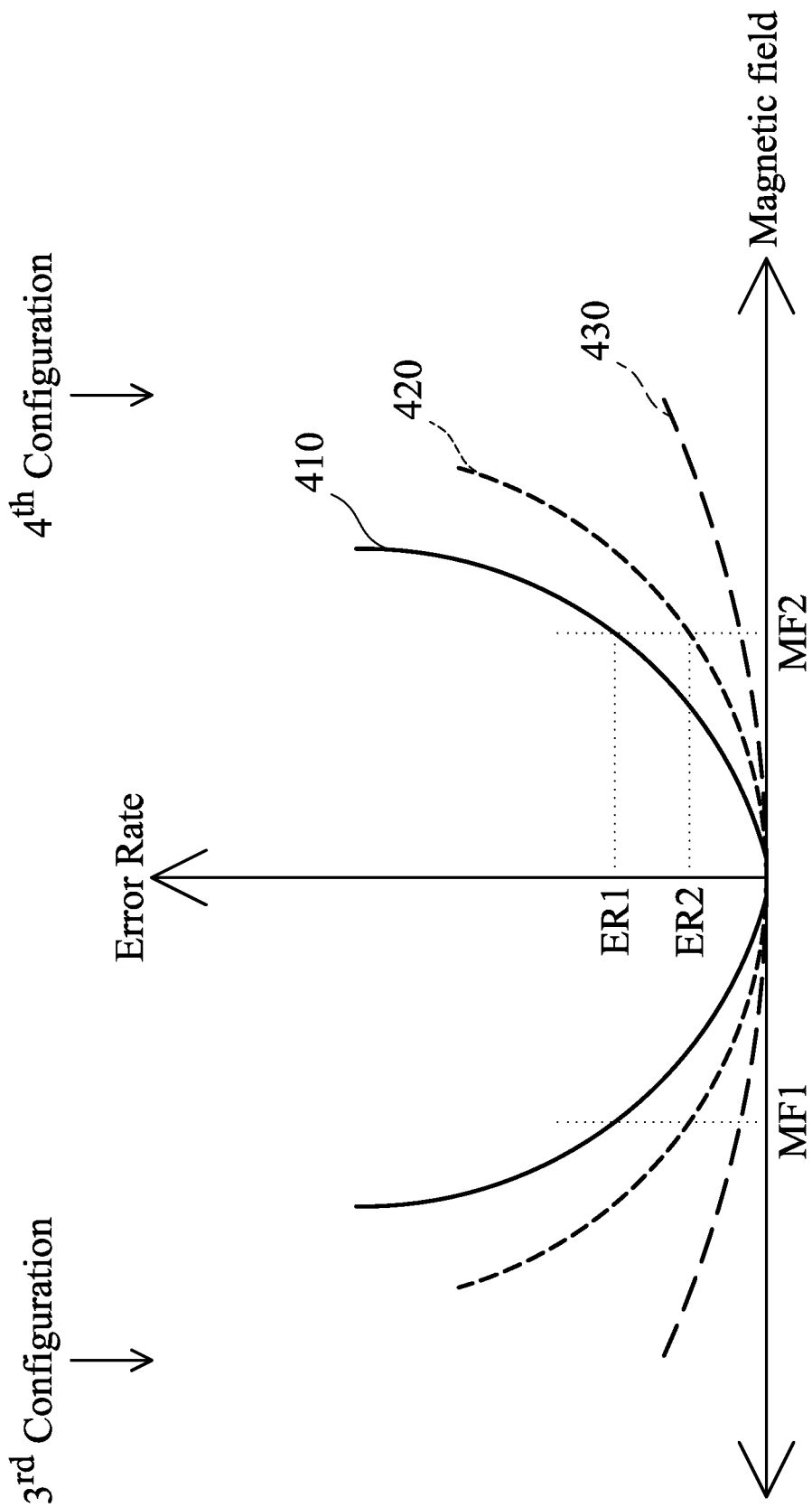
FIG. 4B shows a diagram illustrating the relationship between write error rate of the MTJ device of the sensing cell and the third and fourth configurations of the external magnetic field.

FIG. 4B shows a diagram illustrating the relationship between write error rate of the MTJ device 200_2 of the sensing cell 20 and the third and fourth configurations of the external magnetic field. In FIG. 4B, curves 410, 420 and 430 represent the error rates of the MTJ device 200_2 with a first size, a second size and a third size under the third and fourth configurations of the external magnetic field, respectively, and the first size is smaller than the second size and the second size is smaller than the third size. For the fourth configuration of the external magnetic field, some MTJ devices 200_2 of the sensing array 132 may be switched to the high resistance Rap when the external magnetic field increased, thus error rate is increased. Furthermore, when the size of the MTJ devices 200_2 is decreased, the error rate is increased under the fourth configuration of the external magnetic field. For example, the error rate ER1 of the curve 410 corresponding to the MTJ device 200_2 with a smaller size is greater than the error rate ER2 of the curve 410 corresponding to the MTJ device 200_2 with a larger size. Similarly, for the third configuration of the external magnetic field, some MTJ devices 200_2 of the sensing array 132 may be switched to the low resistance Rp when the external magnetic field decreased, thus error rate is increased. Furthermore, when the size of the MTJ devices 200_2 is decreased, the error rate is increased under the third configuration of the external magnetic field.

As described above, the magnetic field values MF1 and MF2 of the MTJ device 200_2 are determined by adjusting the size of the MTJ device 200_2 according to customer requirements or write error performance under external magnetic field.

Figure 5A:
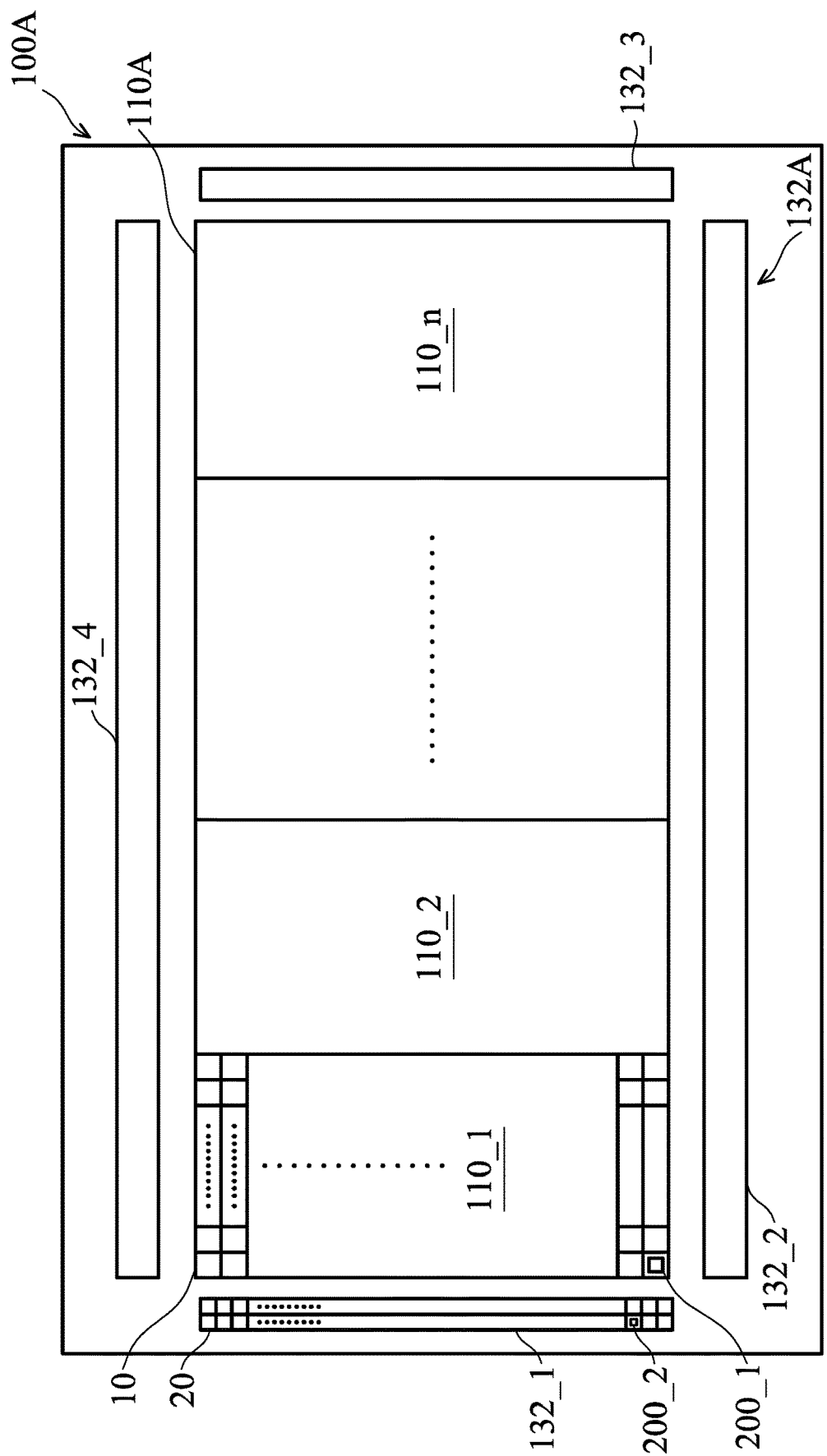
FIG. 5A shows a placement of a memory array and a sensing array in an MRAM, in accordance with some embodiments of the disclosure.

FIG. 5A shows a placement of a memory array 110A and a sensing array 132A in an MRAM 100A, in accordance with some embodiments of the disclosure. In order to simplify the description, the access circuit 120 and the magnetic detection circuit 130 of the MRAM 100A are omitted in FIG. 5A. As described above, the memory array 110A is formed by multiple memory cells 10 arranged in multiple rows and multiple columns. The memory cells 10 of the memory array 110A are used to store data, and each memory cell 10 includes an MTJ device 200_1. In some embodiments, the memory array 110A is formed by multiple memory sub-arrays 110_1 through 110_n.

The sensing array 132A includes multiple sensing sub-arrays 132_1-132_4. Each of the sensing sub-arrays 132_1-132_4 is formed by multiple sensing cells 20 arranged in multiple rows and multiple columns. Compared with the memory array 110A, the sensing sub-arrays 132_1-132_4 are small arrays. For example, the number of sensing cells 20 in each of the sensing sub-arrays 132_1-132_4 is lower than the number of memory cells 10 in the memory array 110A. Each sensing cell 20 includes an MTJ device 200_2 configured to sense a magnetic field. Furthermore, the MTJ device 200_2 of the sensing cell 20 is smaller than the MTJ device 200_1 of the memory cell 10.

In some embodiments, the memory array 110A is surrounded by multiple sensing sub-arrays. For example, the sensing sub-arrays 132_1 is arranged on the left side of the memory array 110A, and the sensing sub-arrays 132_3 is arranged on the right side of the memory array 110A. Furthermore, the sensing sub-arrays 132_2 is arranged at the bottom of the memory array 110A, and the sensing sub-arrays 132_4 is arranged on the top of the memory array 110A.

The sensing sub-arrays 132_1-132_4 are smaller than the memory array 110A. In other words, the number of sensing cells 20 in each of the sensing arrays 132_1-132_4 is lower than the number of memory cells 10 in the memory array 110A. In some embodiments, the minimum size of each of the sensing sub-arrays 132_1-132_4 is determined according to a single byte, i.e., the minimum sensing sub-array is formed by 8, 16, 32 or 64 sensing cells 20, depending on the byte size of the MRAM 100A.

In some embodiments, only a single array (e.g., the sub-array 132_1, 132_2, 132_3 or 132_4) is arranged adjacent to the memory array 110A. Furthermore, the minimum size of the single array is determined according to a single byte, i.e., the minimum sensing array is formed by 8, 16, 32 or 64 sensing cells 20, depending on the byte size of the MRAM 100A.

Figure 5B:
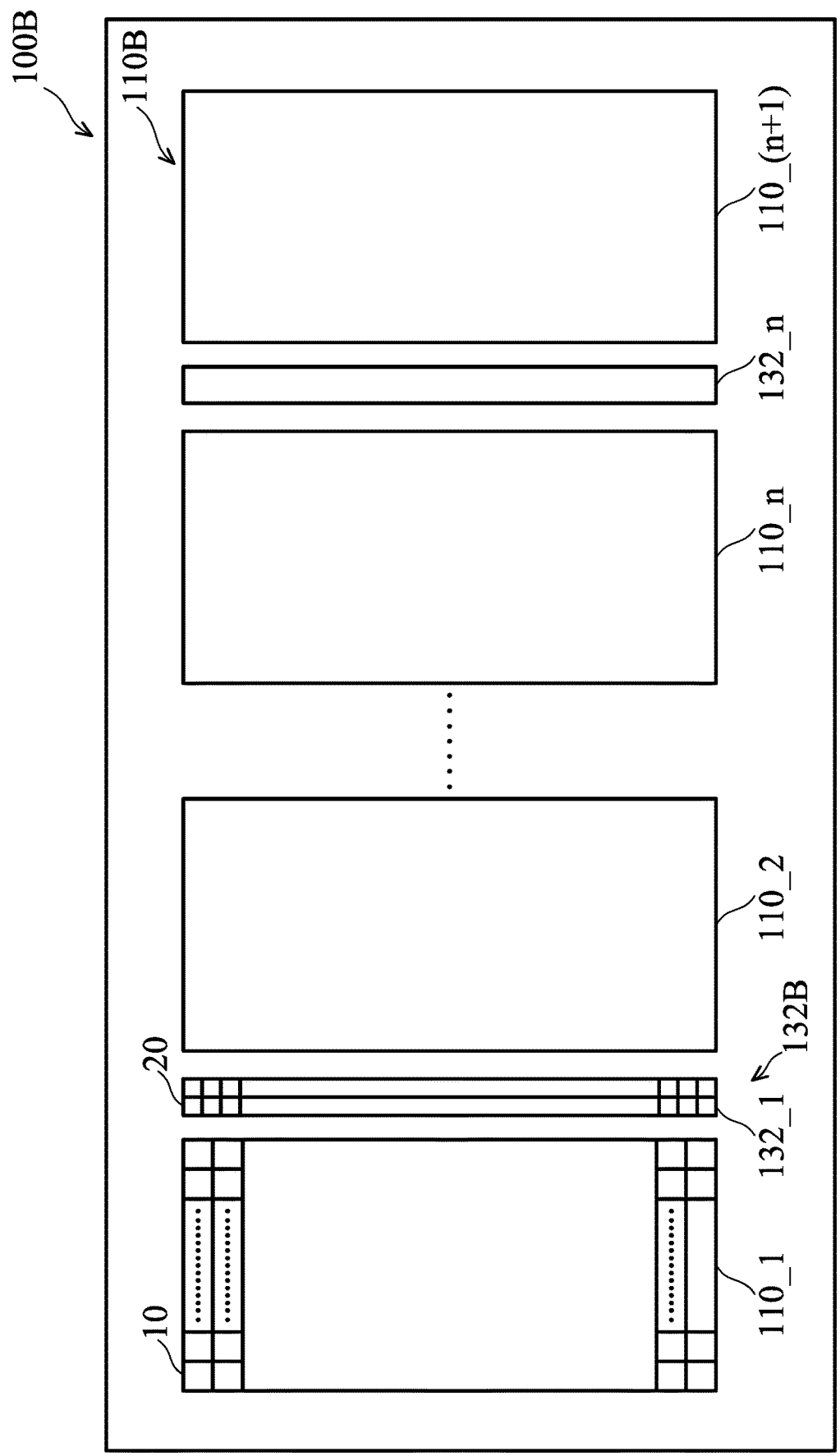
FIG. 5B shows a placement of a memory array and a sensing array of an MRAM, in accordance with some embodiments of the disclosure.

FIG. 5B shows a placement of a memory array 100B and a sensing array 132B of an MRAM 100B, in accordance with some embodiments of the disclosure. In order to simplify the description, the access circuit 120 and the magnetic detection circuit 130 of the MRAM 100B are omitted in FIG. 5B. The memory array 100B includes multiple memory sub-arrays 110_1 through 110_(n+1). Furthermore, the sensing array 132B includes multiple sensing sub-arrays 132_1 through 132_n. Each of the sensing sub-arrays 132_1 through 132_n is arranged between two adjacent memory sub-arrays. For example, the sensing sub-array 132_1 is arranged between the memory sub-arrays 110_1 and 110_2, and the sensing sub-array 132_n is arranged between the memory sub-arrays 110_n and 110_(n+1).

Compared with the memory sub-arrays 110_1 through 110_(n+1), the sensing sub-arrays 132_1 through 132_n are small arrays. Furthermore, the MTJ devices 200_2 of the sensing cell 20 within the sensing sub-arrays 132_1 through 132_n are smaller than the MTJ devices 200_1 of the memory sub-arrays 110_1 through 110_(n+1).

The sensing sub-arrays 132_1 through 132_n are smaller than the memory sub-arrays 110_1 through 110_(n+1). In other words, the number of sensing cells 20 in each of the sensing sub-arrays 132_1 through 132_n is lower than the number of memory cells 10 in each of the memory sub-arrays 110_1 through 110_(n+1). In some embodiments, the minimum size of the sensing sub-array is determined according to a single byte, i.e., the minimum sensing sub-array is formed by 8, 16, 32 or 64 sensing cells 20, depending on the byte size of the MRAM 100B.

In some embodiments, only a single array (e.g., the sub-array 132_1, 132_2, 132_3, . . . or 132_n) is arranged adjacent to the memory array 110B. Furthermore, the minimum size of the single array is determined according to a single byte, i.e., the minimum sensing array is formed by 8, 16, 32 or 64 sensing cells 20, depending on the byte size of the MRAM 100B.

Figure 6:
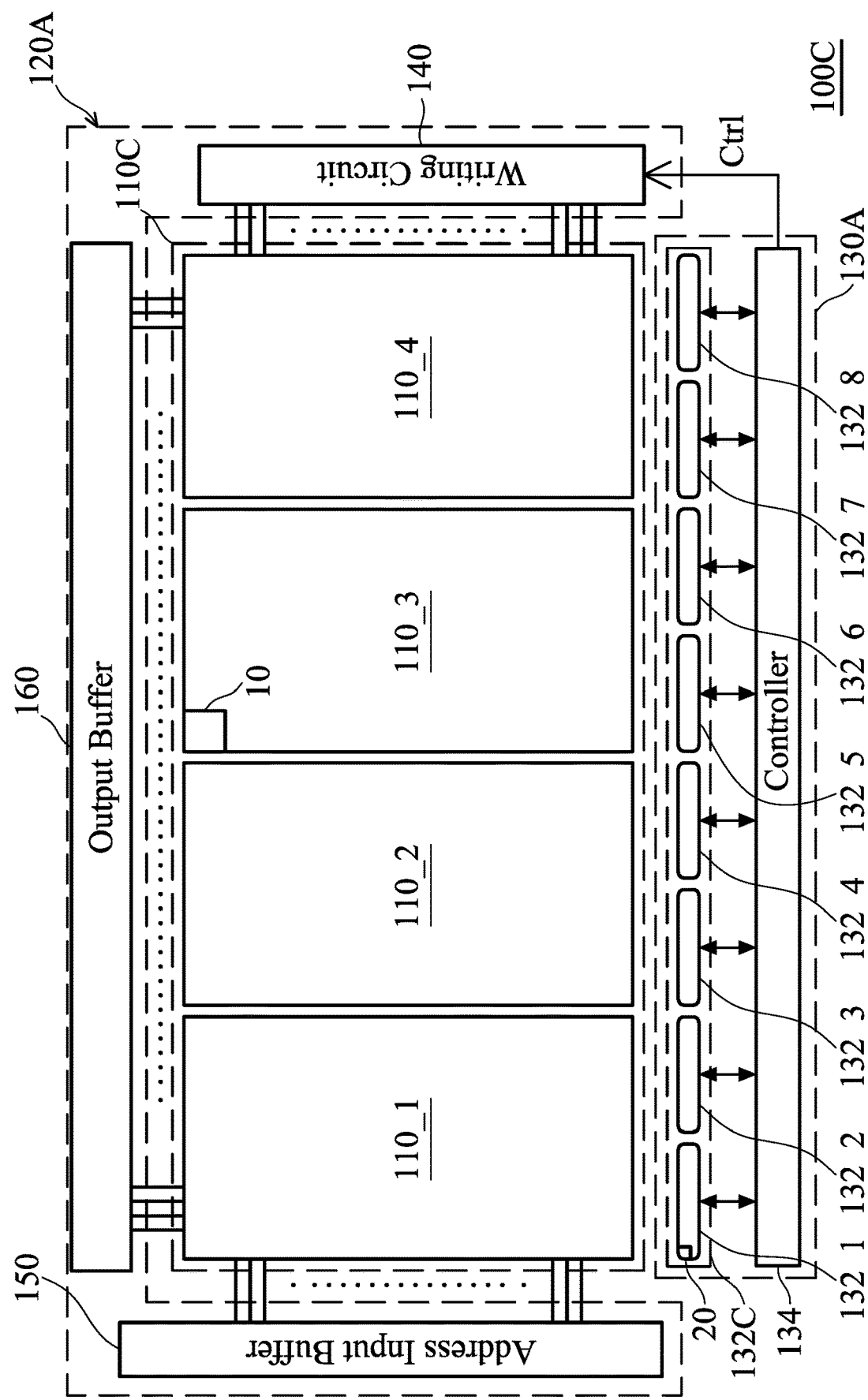
FIG. 6 shows an MRAM, in accordance with some embodiments of the disclosure.

FIG. 6 shows an MRAM 100C, in accordance with some embodiments of the disclosure. The MRAM 100C includes a memory array 110C, an access circuit 120A, and a magnetic detection circuit 130A.

The memory array 110C is used to store data, and the memory array 110C includes the memory sub-arrays 110_1 through 110_1. Each of the memory sub-arrays 110_1 through 110_1 is formed by multiple memory cells 10 arranged in multiple rows and multiple columns. As described above, each memory cell 10 includes an MTJ device 200_1.

The access circuit 120A is capable of access the memory array 110C. For example, according to the address information, the access circuit 120A is capable of performing a read operation to read data from the memory array 110C and/or performing a write operation to write (or program) data into the memory array 110C.

The access circuit 120A includes a writing circuit 140, an address input buffer 150 and an output buffer 160. The writing circuit 140 includes multiple writing drivers (not shown) configured to write (or program) data to the memory cells 10. The address input buffer 150 includes an address decoder (e.g., a row decoder and/or a column decoder) configured to decode a read or write address. The Output buffer 160 includes multiple sense amplifiers (not shown) configured to sense output from the memory array 110C. The writing circuit 140, the address input buffer 150 and the output buffer 160 are used as an example and not to limit the disclosure.

The magnetic detection circuit 130A is capable of detecting an external magnetic field for the MRAM 100C. When the magnetic detection circuit 130A detects that an external magnetic field strength MF of the MRAM 100C exceeds the threshold strength TH, the magnetic detection circuit 130A provides a control signal Ctrl to the write circuit 140 of the access circuit 120A, so as to stop the write operation of the MRAM 100C.

The magnetic detection circuit 130A includes a sensing array 132C and a controller 134. The sensing array 132C is arranged at the bottom of the memory array 110C. The sensing array 132C includes multiple sensing sub-arrays 132_1 through 132_8. Each of the sensing sub-arrays 132_1 through 132_8 is formed by multiple sensing cells 20 arranged in single or multiple rows and in single or multiple columns. As described above, each sensing cell 20 includes an MTJ device 200_2. In some embodiments, the sensing sub-arrays 132_1 through 132_8 are the same size, i.e., the number of sensing cells 20 in the sensing sub-arrays 132_1 through 132_8 are the same. In some embodiments, the sizes of the sensing sub-arrays 132_1 through 132_8 are different.

By periodically accessing the sensing sub-arrays 132_1 through 132_8, the controller 134 can detect the external magnetic field and obtain the external magnetic field strength MF. The controller 134 periodically writes the first data DAT1 into the sensing sub-arrays 132_1 through 132_8 and read back the second data DAT2 of the sensing sub-arrays 132_1 through 132_8, so as to obtain the difference (or error rate) between the first data DAT1 (e.g., the written data) and the second data DAT2 (e.g., the read data). Furthermore, the controller 134 further determines the external magnetic field strength MF according to the difference between the first data DAT1 and the second data DAT2.

In some embodiments, for the sensing sub-arrays 132_1 through 132_8, the second data DAT2 is the same as the first data DAT1 when there is no external magnetic field or the external magnetic field strength MF is not strong enough to change the magnetic state of the sensing cells 20, i.e., the written pattern is equal to the read back pattern. If the external magnetic field strength MF is increased, the magnetic state of the sensing cell 20 may be changed by interference from the external magnetic field.

In some embodiments, taking the sensing sub-array 132_1 as an example for description, the first data DAT1 has a written pattern formed by the same bit (e.g., "0" or "1"), and the first data DAT1 is written into the sensing cells 20 of the sensing sub-array 132_1 so as to set the sensing cells 20 as the same magnetic state (e.g., a parallel magnetic state P_state or an anti-parallel magnetic state AP_state). After the same bit is written into the sensing sub-array 132_1, the sensing cells 20 of the sensing sub-array 132_1 are read to obtain the second data DAT2 having a read back pattern.

In some embodiments, taking the sensing sub-array 132_1 as an example for description, the first data DAT1 has a written pattern including multiple bits "0" and multiple bits "1", and the first data DAT1 is written into the sensing cells 20 of the sensing sub-array 132_1 so as to set the sensing cells 20 as the corresponding magnetic states (e.g., a parallel magnetic state P_state or an anti-parallel magnetic state AP_state). For example, when a bit "1" is written into the sensing cell 20, the sensing cell 20 is switched into an anti-parallel magnetic state AP_state with a high resistance Rap. Conversely, when a bit "0" is written into the sensing cell 20, the sensing cell 20 is switched into a parallel magnetic state P_state with a low resistance Rp. After the first data DAT1 is written into the sensing sub-array 132_1, a portion of the sensing cells 20 of the sensing sub-array 132_1 are written into a parallel magnetic state P_state, and the other sensing cells 20 of the sensing sub-array 132_1 are written into an anti-parallel magnetic state AP_state. Next, the sensing cells 20 of the sensing sub-array 132_1 are read to obtain the second data DAT2 having a read back pattern. In some embodiments, the number of bits "0" and the number of bits "1" are the same in the written pattern. In some embodiments, the number of bits "0" and the number of bits "1" are different in the written pattern.

In some embodiments, the first data DAT1 written to each of the sensing sub-arrays 132_1 through 132_8 have the same the written pattern. In some embodiments, the first data DAT1 written to each of the sensing sub-arrays 132_1 through 132_8 have the various written patterns.

In some embodiments, the context of the written pattern and/or access frequency of the sensing cells 20 can be adjusted according to the difference between the first data DAT1 and the second data DAT2, various applications of an electronic device including the MRAM 100C, and so on.

As described above, the external magnetic field strength MF is detected according to the difference between the first data DAT1 and the second data DAT2. When the difference between the first data DAT1 and the second data DAT2 is increased due to interference from the external magnetic field, the magnetic detection circuit 130A determines that the magnetic field strength MF is increased. Conversely, when the difference between the first data DAT1 and the second data DAT2 is decreased, the magnetic detection circuit 130A determines that the magnetic field strength MF is decreased.

In some embodiments, once the magnetic field strength MF exceeds the field threshold strength TH, the magnetic detection circuit 130A provides the control signal Ctrl to the write circuit 140 of the access circuit 120. In response to the control signal Ctrl, the write circuit 140 stops (or suspends) the write operation of the MRAM 100C. Thus, no write error is present in the MRAM 100C when the magnetic field strength MF exceeds the threshold strength TH. Specifically, the memory array 110C is temporarily disabled for write error prevention.

In some embodiments, the threshold strength TH is determined according to the size of the BJT device 200_2 of the sensing cell 20. In some embodiments, the threshold strength TH is determined according to various applications and/or various operating conditions of an electronic device including the MRAM 100C.

In some embodiments, the magnetic detection circuit 130A counts the number of times that the magnetic field strength MF continues to exceed the threshold strength TH. If the number of times that the magnetic field strength MF continues to exceed the threshold strength TH is greater than a predetermined value, the magnetic detection circuit 130A provides the control signal Ctrl to the write circuit 140 of the access circuit 120, so as to notice the write circuit 140 of the access circuit 120 to stop (or suspend) the write operation of the MRAM 100C.

When the memory array 110C is temporarily disabled for write error prevention, the magnetic detection circuit 130A continues to detecting the external magnetic field for the MRAM 100C by periodically accessing the sensing array 132C.

In some embodiments, once the magnetic field strength MF is less than the threshold strength TH, the magnetic detection circuit 130A provides the control signal Ctrl to the write circuit 140 of the access circuit 120. In response to the control signal Ctrl, the write circuit 140 resumes (or performs) the write operation of the MRAM 100C.

In some embodiments, the magnetic detection circuit 130A counts the number of times that the magnetic field strength MF continues being less than the threshold strength TH. If the number of times that the magnetic field strength MF continues being less than the threshold strength TH, is greater than a predetermined value, the magnetic detection circuit 130A provides the control signal Ctrl to the write circuit 140 of the access circuit 120, so as to notice the write circuit 140 of the access circuit 120 to resume (or perform) the write operation of the MRAM 100C.

Figure 7:
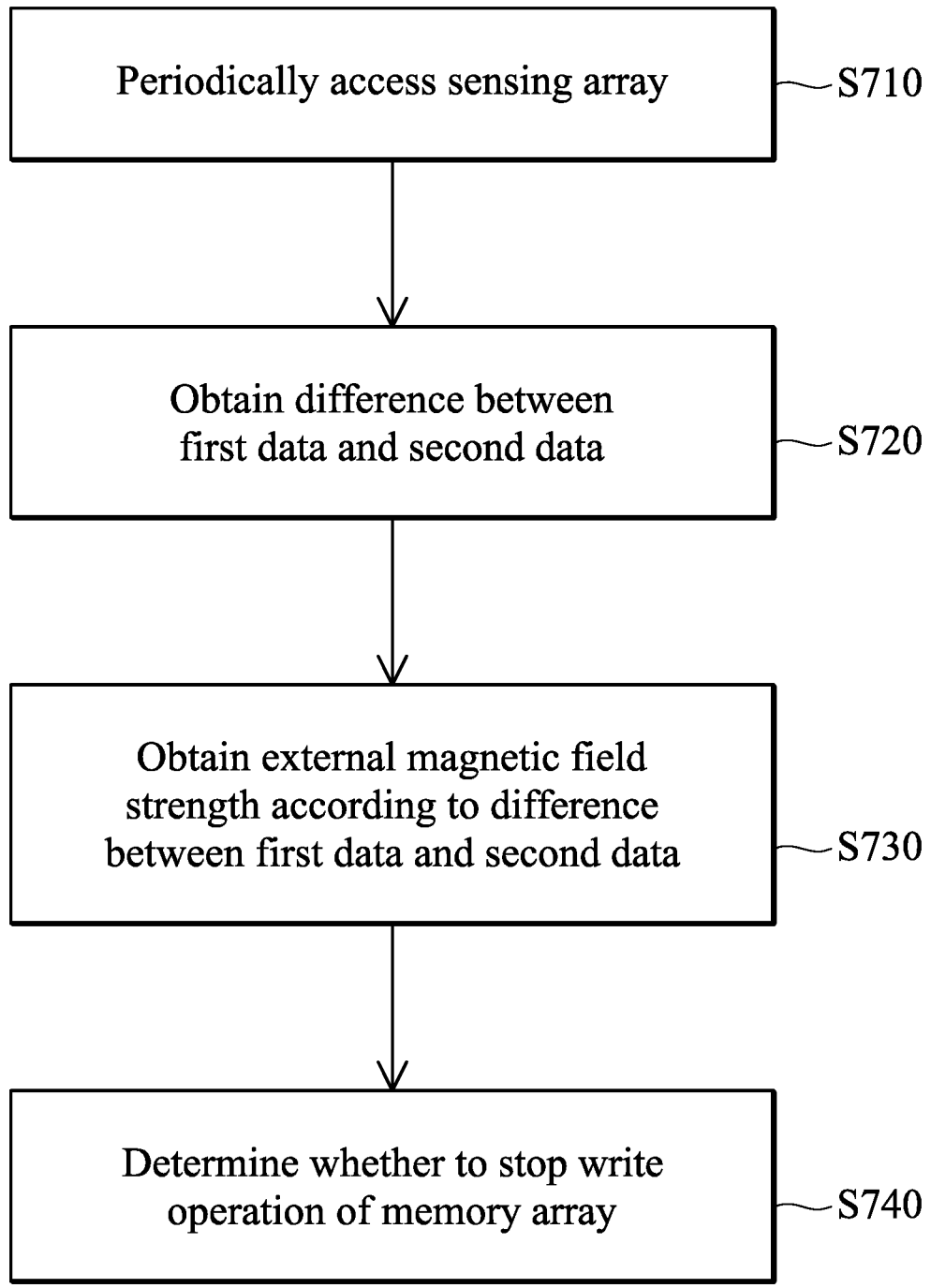
FIG. 7 shows an operation method for an MRAM, in accordance with some embodiments of the disclosure.

FIG. 7 shows an operation method for an MRAM (e.g., 100, 100A, 100B, 100C), in accordance with some embodiments of the disclosure.

The MRAM includes a memory array 110 formed by multiple memory cells 10 and a sensing array 132 formed by multiple sensing cells 20. Each of the memory cells 10 includes an MTJ device 200_1, and each of the sensing cells 20 includes an MTJ device 200_2. Furthermore, the MTJ device 200_1 within the memory cell 10 is larger than the MTJ device 200_1 within the sensing cell 20. There are more memory cells 10 than there are sensing cells 20.

In some embodiments, the sensing array 132 is arranged along the memory array 110. For example, the sensing array 132 is arranged at one side of the memory array 110. In some embodiments, the sensing array 132 includes multiple sensing sub-arrays and the memory array 110 includes multiple memory sub-arrays, and each sensing sub-array is arranged between the two adjacent memory sub-arrays.

In operation S710, the sensing array 132 is periodically accessed with a constant clock signal. As described above, the first data DAT1 with the written pattern is written into the sensing array 132, and then the second data DAT2 with the read back pattern is obtained by reading back the data of the sensing array 132.

In some embodiments, a written pattern is formed by the same bit (e.g., "0" or "1"), and the first data DAT1 is written into the sensing cells 20 of the sensing array 132, so as to set the sensing cells 20 as the same magnetic state (e.g., a parallel magnetic state P_state or an anti-parallel magnetic state AP_state).

In some embodiments, a written pattern is formed by multiple bits "0" and multiple bits "1", and the first data DAT1 is written into the sensing cells 20 of the sensing array 132, so as to set a portion of the sensing cells 20 as a parallel magnetic state P_state and the remaining sensing cells 20 as an anti-parallel magnetic state AP_state.

In operation S720, the difference between the first data DAT1 (i.e. the written data) and the second data DAT2 (i.e. the read data) is obtained.

In operation S730, according to the difference between the first data DAT1 and the second data DAT2, the external magnetic field strength MF is obtained. When the difference between the first data DAT1 and the second data DAT2 is increased due to interference from the external magnetic field, it is determines that the magnetic field strength MF is increased. Conversely, when the difference between the first data DAT1 and the second data DAT2 is decreased, it is determined that the magnetic field strength MF is decreased.

In operation S740, a determination is made as to whether or not to stop the write operation on the memory array 110 according to the external magnetic field strength MF. As described above, if the external magnetic field strength MF of the MRAM 100C exceeds a threshold strength TH, the write operation is stopped of the MRAM 100C, thereby preventing write error. Conversely, if the external magnetic field strength MF of the MRAM 100C does not exceed the threshold strength TH, the write operation is performed.

Embodiments of MRAM including a magnetic detection circuit are provided. The magnetic detection circuit includes a plurality of sensing cells 20 capable of detecting an external magnetic field of the MRAM. Specifically, the sensing cells function as a magnetic sensor to detect the external magnetic field prior to the MRAM write operation. By periodically accessing the sensing cells, the external magnetic field strength MF of the MRAM is obtained according to the error rate of the written data (i.e. the first data DAT1) and the read data (i.e. the second data DAT2) of the sensing cells. The MTJ devices 200_2 of the sensing cells 20 have a smaller size than the MTJ devices 200_1 of the memory cells 10. When the magnetic field strength MF exceeds a field threshold strength TH, the magnetic detection circuit is configured to notice the MRAM to stop the write operation until it is detected that the magnetic field strength MF is less than the field threshold strength TH, thereby preventing write error for the MRAM. Furthermore, by using the magnetic detection circuit to detect the external magnetic field, no additional fabrication process is require due to the MTJ devices 200_1 and 200_2 are fabricated with the same MRAM process. Moreover, the magnetic detection circuit enables the application of MRAM in most magnetic environment without external shield.

In some embodiments, a magnetic detection circuit for a magnetic random access memory (MRAM) is provided. The magnetic detection circuit includes a sensing array including a plurality of sensing cells and a controller. Each of the sensing cells includes a first magnetic tunnel junction (MTJ) device. The controller configured to access the first MRAM cells to detect the external magnetic field strength of the MRAM. The controller determines whether to stop a write operation of a plurality of memory cells of the MRAM according to the external magnetic field strength of the MRAM, and each of the memory cells includes a second MTJ device. The first MTJ device is smaller than the second MTJ device.

In some embodiments, an MRAM is provided. The MRAM includes a plurality of sensing cells, a plurality of memory cells arranged in at least one memory array, a controller coupled to the plurality of sensing cells, and an access circuit coupled to the plurality of memory cells. Each of the sensing cells includes a first magnetic tunnel junction (MTJ) device. Each of the memory cells includes a second MTJ device. The controller is configured to write first data into the plurality of sensing cells and read second data from the plurality of sensing cells after the first data is written. The access circuit is configured to access the plurality of memory cells. The controller is configured to obtain difference between the first data and the second data and to control the access circuit to stop writing the memory array when the difference between the first data and the second data indicates that the external magnetic field strength of the MRAM is greater than a threshold value.

In some embodiments, an operation method of a magnetic random access memory (MRAM) is provided. A plurality of sensing cells are periodically accessed to determine the external magnetic field strength of the MRAM, wherein the plurality of sensing cells are arranged along a plurality of memory cells of the MRAM. A determination is made as to whether or not to stop a write operation on the plurality of memory cells according to the external magnetic field strength of the MRAM. The sensing cell and the memory cell each includes a magnetic tunnel junction (MTJ) device, and the MTJ device of the sensing cell is smaller than the MTJ device of the memory cell.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A magnetic detection circuit for a magnetic random access memory (MRAM), comprising:
   a sensing array comprising a plurality of sensing cells, wherein each of plurality of sensing cells comprises a first magnetic tunnel junction (MTJ) device; and
   a controller configured to periodically write and read the sensing cells to detect an external magnetic field strength of the MRAM,
   wherein the controller determines whether to stop a write operation of a plurality of memory cells of the MRAM according to the external magnetic field strength of the MRAM, and each of plurality of memory cells comprises a second MTJ device,
   wherein the first MTJ device is smaller than the second MTJ device,
   wherein the controller is configured to obtain a difference between first data written to the sensing cells and second data read from the sensing cells, and the difference between the first data and the second data represents the external magnetic field strength of the MRAM.

2. The magnetic detection circuit as claimed in claim 1, wherein when the difference between the first data and the second data is greater than a threshold value, the write operation of the plurality of memory cells of the MRAM is stopped by the controller until the difference between the first data and the second data is less than the threshold value.

3. The magnetic detection circuit as claimed in claim 1, wherein when the external magnetic field strength is increased, the difference between the first data and the second data is increased, and when the external magnetic field strength is decreased, the difference between the first data and the second data is decreased.

4. The magnetic detection circuit as claimed in claim 1, wherein some of the first MTJ devices are switched to an anti-parallel magnetic state with a high resistance, and the remaining first MTJ devices are switched to a parallel magnetic state with a low resistance.

5. The magnetic detection circuit as claimed in claim 1, wherein the plurality of memory cells are arranged in a plurality of rows and a plurality of columns of a memory array, and the plurality of sensing cells are arranged around the memory array.

6. The magnetic detection circuit as claimed in claim 1, wherein the number of the plurality of memory cells is greater than the number of the plurality of sensing cells.

7. A magnetic random access memory (MRAM), comprising:
   a plurality of sensing cells, wherein each of the plurality of sensing cells comprises a first magnetic tunnel junction (MTJ) device;
   a plurality of memory cells arranged in at least one memory array, wherein each of the plurality of memory cells comprises a second MTJ device;
   a controller coupled to the plurality of sensing cells, and configured to write first data into the plurality of sensing cells and read second data from the plurality of sensing cells after the first data is written; and
   an access circuit coupled to the plurality of memory cells, and configured to access the plurality of memory cells,
   wherein the controller is configured to obtain difference between the first data and the second data and to control the access circuit to stop writing the memory array when the difference between the first data and the second data indicates that external magnetic field strength of the MRAM is greater than a threshold strength.

8. The MRAM as claimed in claim 7, wherein the first MTJ device is smaller than the second MTJ device.

9. The MRAM as claimed in claim 7, wherein when the external magnetic field strength is increased, the difference between the first data and the second data is increased, and when the external magnetic field strength is decreased, the difference between the first data and the second data is decreased.

10. The MRAM as claimed in claim 7, wherein when the controller writes the first data into the plurality of sensing cells, some of the first MTJ devices are switched to an anti-parallel magnetic state with a high resistance, and the remaining first MTJ devices are switched to a parallel magnetic state with a low resistance.

11. The MRAM as claimed in claim 7, wherein the plurality of memory cells are arranged in a plurality of rows and a plurality of columns of the memory array, and the plurality of sensing cells are arranged around the memory array.

12. The MRAM as claimed in claim 7, wherein a first portion of the memory cells are arranged in a plurality of rows and a plurality of columns of a first memory sub-array, and a second portion of the memory cells are arranged in a plurality of rows and a plurality of columns of a second memory sub-array, wherein the plurality of sensing cells are arranged between the first memory sub-array and the second memory sub-array.

13. The MRAM as claimed in claim 7, wherein the number of the plurality of memory cells is greater than the number of the plurality of sensing cells.

14. An operation method of a magnetic random access memory (MRAM), comprising:
   periodically writing and reading a plurality of sensing cells to determine external magnetic field strength of the MRAM, wherein the plurality of sensing cells are arranged along a plurality of memory cells of the MRAM; and determining whether to stop a write operation of the plurality of memory cells according to the external magnetic field strength of the MRAM, wherein the sensing cell and the memory cell each comprises a magnetic tunnel junction (MTJ) device, and the MTJ device of the sensing cell is smaller than the MTJ device of the memory cell, wherein periodically writing and reading the plurality of sensing cells to determine the external magnetic field strength of the MRAM further comprises:

writing first data into the plurality of sensing cells;

reading second data from the plurality of sensing cells after the first data is written; and obtaining difference between the first data and the second data, wherein the difference between the first data and the second data represents the external magnetic field strength of the MRAM.

15. The operation method as claimed in claim 14, wherein when the external magnetic field strength is increased, the difference between the first data and the second data is increased, and when the external magnetic field strength is decreased, the difference between the first data and the second data is decreased.

16. The operation method as claimed in claim 14, wherein when the first data is written into the plurality of sensing cells, some of the first MTJ devices are switched to an anti-parallel magnetic state with a high resistance, and the remaining first MTJ devices are switched to a parallel magnetic state with a low resistance.

17. The operation method as claimed in claim 14, wherein determining whether to stop the write operation of the plurality of memory cells according to the external magnetic field strength of the MRAM further comprises:

stopping the write operation of the plurality of memory cells when the difference between the first data and the second data is greater than a threshold value; and resuming the write operation of the plurality of memory cells when the difference between the first data and the second data is less than the threshold value.

18. The operation method as claimed in claim 14, wherein the plurality of memory cells are arranged in a plurality of rows and a plurality of columns of a memory array, and the sensing array is arranged around the memory array.

19. The magnetic detection circuit as claimed in claim 1, wherein a first portion of the memory cells are arranged in a plurality of rows and a plurality of columns of a first memory sub-array, and a second portion of the memory cells are arranged in a plurality of rows and a plurality of columns of a second memory sub-array, wherein the plurality of sensing cells are arranged between the first memory sub-array and the second memory sub-array.

20. The operation method as claimed in claim 14, wherein a first portion of the memory cells are arranged in a plurality of rows and a plurality of columns of a first memory sub-array, and a second portion of the memory cells are arranged in a plurality of rows and a plurality of columns of a second memory sub-array, wherein the plurality of sensing cells are arranged between the first memory sub-array and the second memory sub-array.

* * * * *